US009678558B2

United States Patent
Erez

(10) Patent No.: US 9,678,558 B2
(45) Date of Patent: Jun. 13, 2017

(54) MEMORY SYSTEM AND METHOD FOR POWER MANAGEMENT FOR REDUCING A VARIABLE CREDIT VALUE BY A COMPUTED CONSUMED ENERGY VALUE FOR EACH CORRESPONDING UPDATED CYCLE

(71) Applicant: SanDisk Technologies LLC, Plano, TX (US)

(72) Inventor: Eran Erez, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/207,221

(22) Filed: Jul. 11, 2016

(65) Prior Publication Data

US 2016/0370841 A1 Dec. 22, 2016

Related U.S. Application Data

(62) Division of application No. 14/741,045, filed on Jun. 16, 2015, now Pat. No. 9,418,712.

(51) Int. Cl.
| | | |
|---|---|---|
| *G11C 5/00* | (2006.01) | |
| *G11C 11/34* | (2006.01) | |
| *G11C 5/14* | (2006.01) | |
| *G11C 8/00* | (2006.01) | |
| *G06F 1/32* | (2006.01) | |
| *G06F 1/26* | (2006.01) | |
| *G11C 16/30* | (2006.01) | |
| *G11C 16/10* | (2006.01) | |

(52) U.S. Cl.
CPC .............. *G06F 1/3225* (2013.01); *G06F 1/26* (2013.01); *G11C 16/10* (2013.01); *G11C 16/30* (2013.01)

(58) Field of Classification Search
USPC ...... 365/52, 185.11, 185.17, 185.21, 185.33, 365/226, 230.03
See application file for complete search history.

(56) References Cited

U.S. PATENT DOCUMENTS

| 5,483,486 | A | 1/1996 | Javanifard et al. |
|---|---|---|---|
| 5,845,142 | A | 12/1998 | Hayasaka |
| 6,021,076 | A | 2/2000 | Woo et al. |
| 6,552,945 | B2 | 4/2003 | Cooper et al. |

(Continued)

FOREIGN PATENT DOCUMENTS

| TW | 200809469 A | 2/2008 |
|---|---|---|
| TW | 200937178 A | 9/2009 |

OTHER PUBLICATIONS

Erez, E., U.S. Appl. No. 14/741,075 entitled, "Memory System and Method for Power Management", filed Jun. 16, 2015, 48 pages.

(Continued)

*Primary Examiner* — Trong Phan
(74) *Attorney, Agent, or Firm* — Brinks Gilson & Lione

(57) ABSTRACT

In one embodiment, a memory system is provided comprising at least one memory die, a sensor configured to sense an average amount of power consumed by the memory system over a time period, and a controller. The controller is configured to maintain a token bucket that indicates an amount of power currently available for memory operations in the at least one memory die and is further configured to reduce a number of tokens in the token bucket by an amount of power consumed over the time period as indicated by the average amount of power sensed by the sensor over the time period.

19 Claims, 13 Drawing Sheets

(56) References Cited

U.S. PATENT DOCUMENTS

| | | |
|---|---|---|
| 7,064,994 B1 | 6/2006 | Wu |
| 7,272,063 B1 | 9/2007 | Egerer et al. |
| 7,370,168 B2 | 5/2008 | Kanamori et al. |
| 7,394,694 B2 | 7/2008 | Micheloni et al. |
| 7,782,683 B2 | 8/2010 | Sohn et al. |
| 7,818,592 B2 | 10/2010 | Meier et al. |
| 8,335,123 B2 | 12/2012 | Sprouse |
| 8,363,442 B2 | 1/2013 | Liu et al. |
| 8,654,563 B2 | 2/2014 | Confalonieri et al. |
| 8,837,217 B2 | 9/2014 | Chu |
| 2005/0071701 A1 | 3/2005 | Luick |
| 2007/0211551 A1 | 9/2007 | Yogev et al. |
| 2008/0263373 A1 | 10/2008 | Meier et al. |
| 2009/0190427 A1 | 7/2009 | Brittain et al. |
| 2011/0122691 A1 | 5/2011 | Sprouse |
| 2013/0003555 A1 | 1/2013 | Moran et al. |
| 2014/0254285 A1 | 9/2014 | Eguchi et al. |
| 2016/0026231 A1 | 1/2016 | Ignowski et al. |
| 2016/0062421 A1 | 3/2016 | Sugawara et al. |

OTHER PUBLICATIONS

Office Action and Search Report, and English language translation thereof, in Taiwanese Application No. 099140091 dated Jul. 31, 2015, 7 pages.

Office Action for U.S. Appl. No. 14/741,075, dated Mar. 23, 2016, 7 pages.

Ex Parte Quayle Action for U.S. Appl. No. 14/741,045 dated Feb. 11, 2016, 14 pages.

Notice of Allowance for U.S. Appl. No. 14/741,075, dated Jun. 14, 2016, 5 pages.

Notice of Allowance for U.S. Appl. No. 14/741,045, dated Jun. 28, 2016, 7 pages.

Office Action for U.S. Appl. No. 15/190,974, dated Nov. 30, 2016, 6 pages.

Office Action for U.S. Appl. No. 14/757,780, dated Jan. 4, 2017, 9 pages.

Notice of Allowance in U.S. Appl. No. 15/190,974, dated Mar. 29, 2017, 9 pages.

| Set Number | Unconstraint Power [W] | SSD Allowed Power [W] | Power Burst Duration [mSec] | Bucket Capacity [tokens] | Steady State Power [W] | Bucket Fill Rate [tokens/sec] | Usage |
|---|---|---|---|---|---|---|---|
| 1 | 5 | 3 | 5 | 25,000 | 2.99 | 2,989,950 | Sustain |
| 2 | 5 | 3 | 10 | 50,000 | 2.98 | 2,979,798 | |
| 3 | 5 | 3 | 15 | 75,000 | 2.97 | 2,969,543 | |
| 4 | 5 | 3 | 20 | 100,000 | 2.96 | 2,959,184 | |
| 5 | 5 | 3 | 25 | 125,000 | 2.95 | 2,948,718 | Burst |

FIG. 14

MEMORY SYSTEM AND METHOD FOR POWER MANAGEMENT FOR REDUCING A VARIABLE CREDIT VALUE BY A COMPUTED CONSUMED ENERGY VALUE FOR EACH CORRESPONDING UPDATED CYCLE

CROSS-REFERENCE TO RELATED APPLICATION

This application is a divisional of U.S. patent application Ser. No. 14/741,045 (now U.S. Pat. No. 9,418,712), filed Jun. 16, 2015, which is hereby incorporated by reference.

BACKGROUND

Some memory systems, such as solid-state drives (SSDs), contain a plurality of memory dies (e.g., in a multi-die package) that can be read or written in parallel. Different operations may consume different energy. For example, some operations (e.g., program operations) may require higher energy than others (e.g. read operations). Memory systems typically have a maximum power threshold that limits the number of operations that can be executed at any given time and/or the number of dies that can be used at any given time.

BRIEF DESCRIPTION OF THE DRAWINGS

FIG. 14 is a table of different energy bucket configurations of an embodiment.

DETAILED DESCRIPTION OF THE PRESENTLY PREFERRED EMBODIMENTS

Overview

Figure 16:
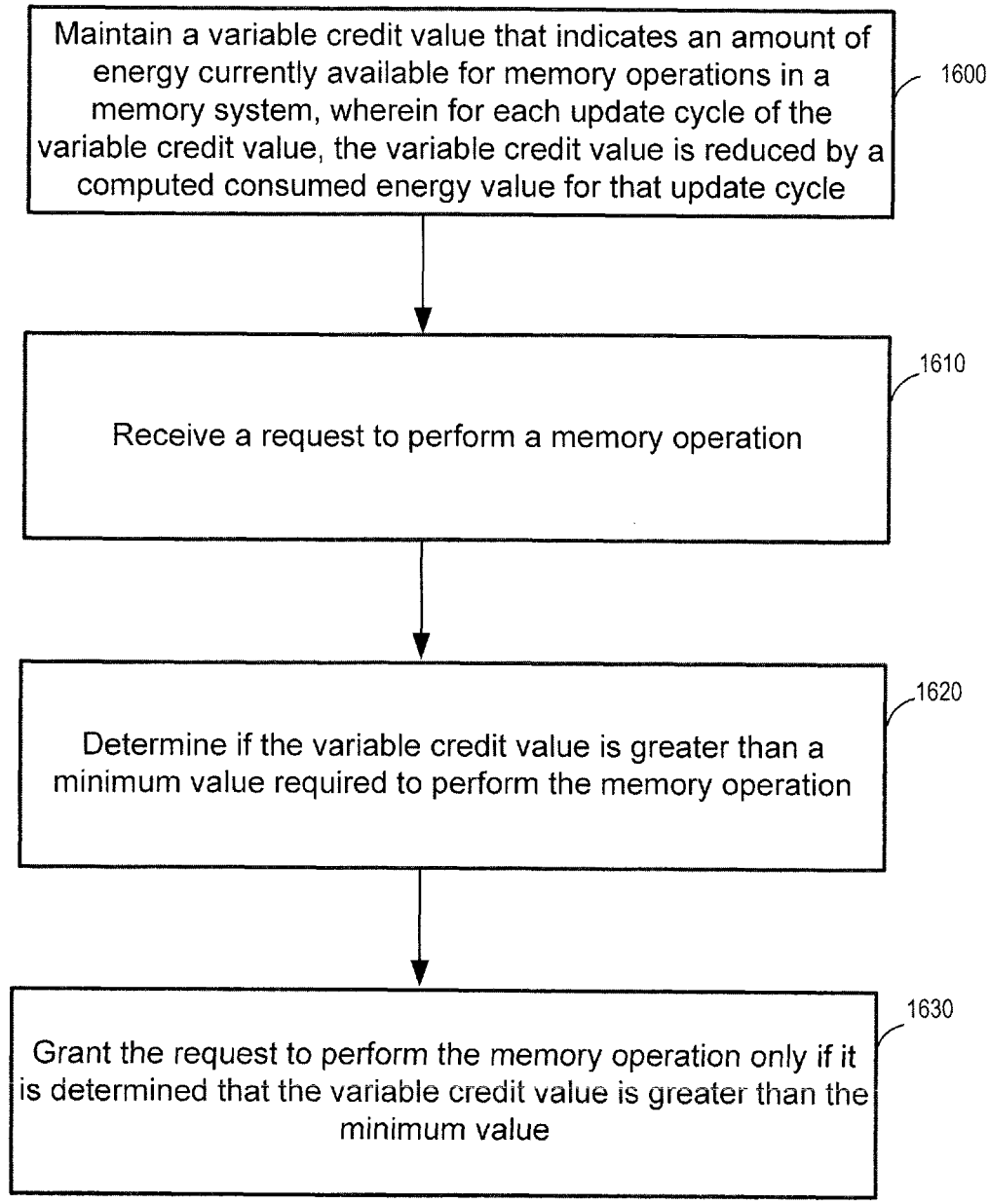
FIG. 16 is a flow chart of a method for power management of an embodiment.

By way of introduction, the below embodiments relate to a memory system and method for power management. In one embodiment (shown in FIG. 16), a method for power management is provided. This method comprises maintaining a variable credit value indicates an amount of energy currently available for memory operations in a memory system, wherein for each update cycle of the variable credit value, the variable credit value is reduced by a computed consumed energy value for that update cycle (act 1600); receiveing a request to perform a memory operation(act 1610); determining if the variable credit value is greater than a minimum value required to perform the memory operation (act 1620); and granting the request to perform the memory operation only if it is determined that the variable credit value is greater than the minimum value (act 1630). In one embodiment, the consumed energy is computed by determining a product of an update cycle duration and average sensed power.

In another embodiment, a memory system is provided comprising at least one memory die, a sensor configured to sense an average amount of power consumed by the memory system over a time period, and a controller in communication with the at least one memory die and the sensor. The controller is configured to maintain a token bucket that indicates an amount of energy currently available for memory operations in the at least one memory die and is further configured to reduce a number of tokens in the token bucket by an amount of energy consumed over a time period as indicated by the average amount of power sensed by the sensor over that time period. In one embodiment, the amount of energy consumed is a product of an update cycle duration and the average sensed power.

Figure 17:
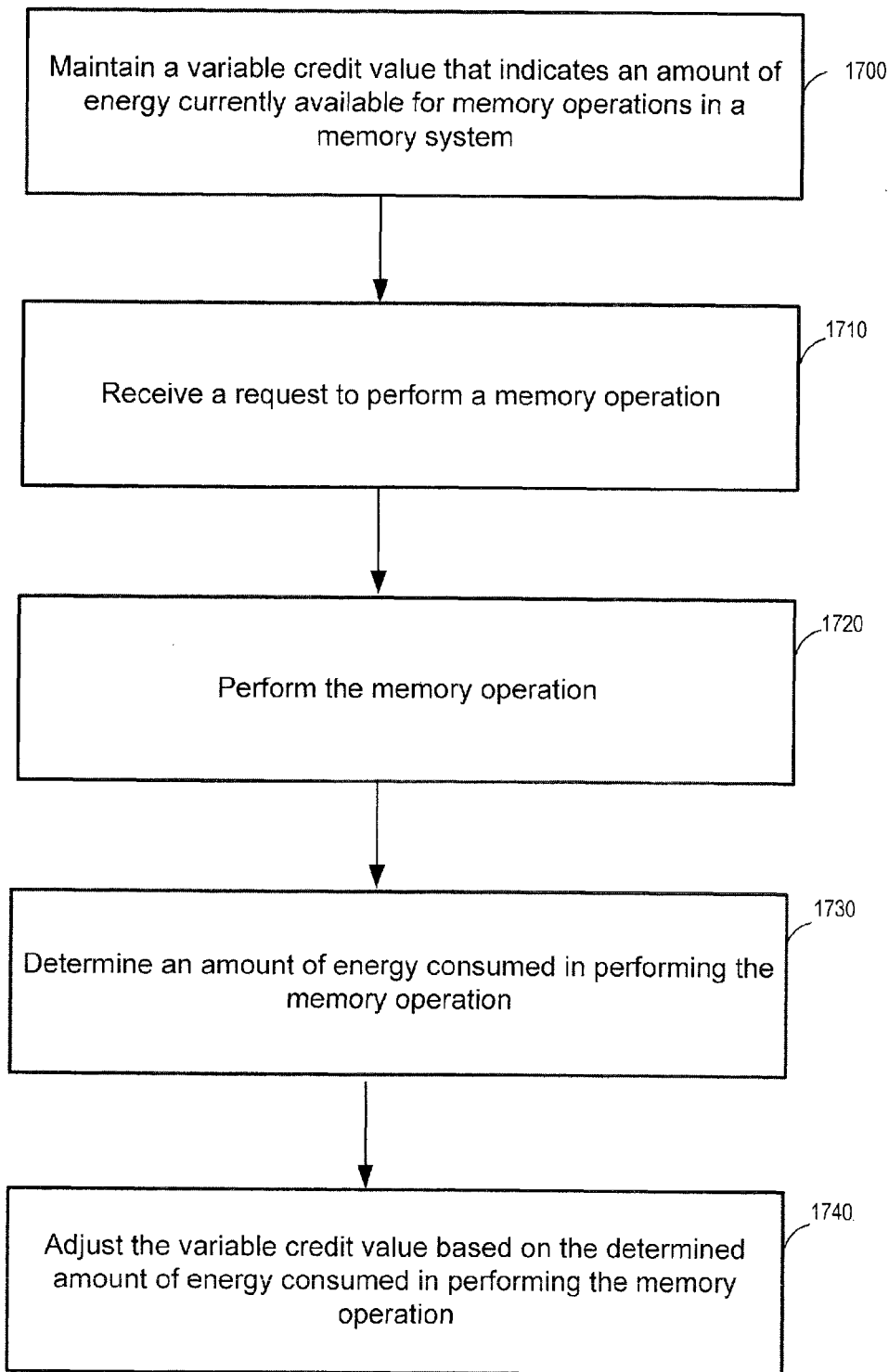
FIG. 17 is a flow chart of a method for power management of an embodiment.

In another embodiment (shown in FIG. 17), a method for power management in a memory system is provided. In this embodiment, the memory system maintains a variable credit value that indicates an amount of energy currently available for memory operations in the memory system (act 1700); receives a request to perform a memory operation (act 1710); performs the memory operation (act 1720); determines an amount of energy consumed in performing the memory operation (act 1730); and adjusts the variable credit value based on the determined amount of energy consumed in performing the memory operation (act 1740).

In one embodiment, the amount of energy consumed in performing the memory operation is determined by a memory die in which the memory operation was performed.

In another embodiment, the amount of energy consumed in performing the memory operation is determined by a controller in the memory system after the controller receives, from a memory die in the memory system, an indication of an amount of time spent by the memory die in performing the operation.

In some embodiments, the amount of energy consumed in performing the memory operation is determined by a controller in the memory system after the controller receives, from a memory die in the memory system, an indication of a number of programming loops used by the memory die in performing the operation.

In some embodiments, the amount of energy consumed in performing the memory operation is determined by a controller after timing how long it took to perform the memory operation.

In some embodiments, the memory system also reduces the variable credit value by a first amount prior to performing the memory operation, wherein the first amount is different from the determined amount of energy consumed in performing the memory operation, and wherein, after the memory operation is performed, the variable credit value is adjusted upward if the first amount is greater than the determined amount and is adjusted downward if the first amount is less than the determined amount.

In some embodiments, the memory system performs the memory operation only after determining that the variable credit value is greater than a minimum value.

In another embodiment, a method for power management in a memory system is provided. In this embodiment, the memory system stores a plurality of variable credit value configurations and maintains a variable credit value that indicates an amount of power currently available for memory operations in the memory system. The memory system selects one of the plurality of variable credit value configurations, wherein each variable credit value configuration specifies a maximum variable credit value and a credit value fill rate, and increases the variable credit value at the credit value fill rate specified by the selected one of the plurality of variable credit value configurations.

In some embodiments, the plurality of variable credit value configurations is stored in a file system in the memory system.

In one embodiment, the one of the plurality of variable credit value configurations is selected to achieve an average variable credit value. In some embodiments, the average variable credit value is 50% of a maximum value.

In some embodiments, the memory system maintains the variable credit value using a client-server arrangement. In some embodiments, the client-server arrangement includes a power server that is configured to grants power usage to clients while maintaining a maximum power consumption limit. In some embodiments, the power server is further configured to assign clients with priority levels and grant power usage to clients according to the assigned priority levels.

In another embodiment, a memory system is provided comprising at least one memory die and a controller. The controller is configured to maintain a token bucket that indicates an amount of energy currently available for memory operations in the at least one memory die; select one of a plurality of token bucket configurations, wherein each token bucket configuration specifies a maximum number of tokens for the token bucket and a token fill rate; and increase a number of tokens in the token bucket at a token fill rate specified by the selected one of the plurality of token bucket configurations.

In some embodiments, the plurality of token bucket configurations is stored in a file system in the memory system.

In one embodiment, the one of the plurality of variable credit value configurations is selected to achieve an average variable credit value. In some embodiments, the average variable credit value is 50% of a maximum value.

In some embodiments, the memory system maintains the variable credit value using a client-server arrangement.

In another embodiment, a memory system is provided comprising a memory and a token bucket module configured to maintain a token bucket that indicates an amount of energy currently available for memory operations in the memory, wherein a maximum number of tokens for the token bucket and a token fill rate are specified by selecting one of a plurality of token bucket configurations stored in the memory system.

In some embodiments, the memory is a three-dimensional memory. Also, in some embodiments, the memory system is embedded in a host, while, in other embodiments, the memory system is removably connected to a host.

In some embodiments, the method of power management is performed in a controller in the memory system. In other embodiments, the memory system is part of a storage module having at least one additional memory system, and the method is performed in a storage controller of the storage module.

Other embodiments are possible, and each of the embodiments can be used alone or together in combination. Accordingly, various embodiments will now be described with reference to the attached drawings.

Exemplary Embodiments

Figure 1A:
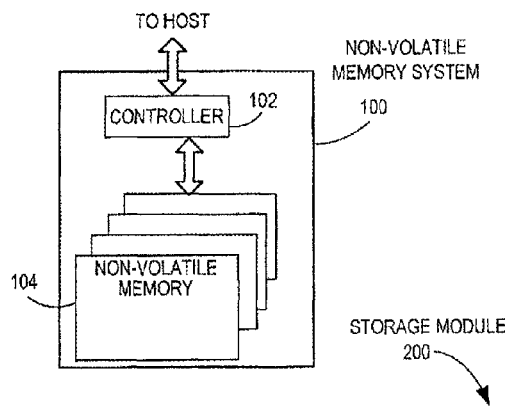
FIG. 1A is a block diagram of a non-volatile memory system of an embodiment.
Figure 1B:
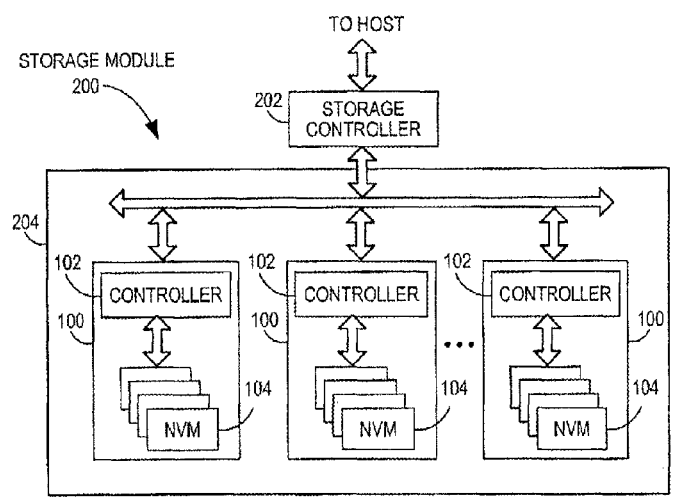
FIG. 1B is a block diagram illustrating an exemplary storage module of an embodiment.
Figure 1C:
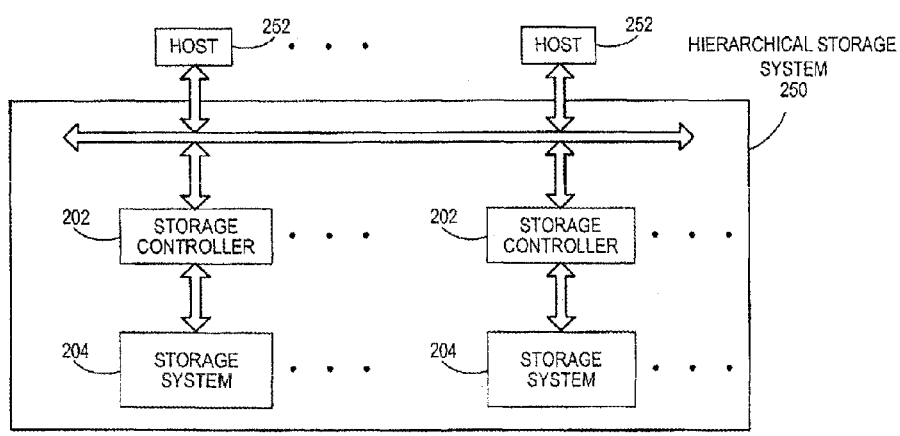
FIG. 1C is a block diagram illustrating a hierarchical storage system of an embodiment.

Memory systems suitable for use in implementing aspects of these embodiments are shown in FIGS. 1A-1C. FIG. 1A is a block diagram illustrating a non-volatile memory system 100 according to an embodiment of the subject matter described herein. Referring to FIG. 1A, non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
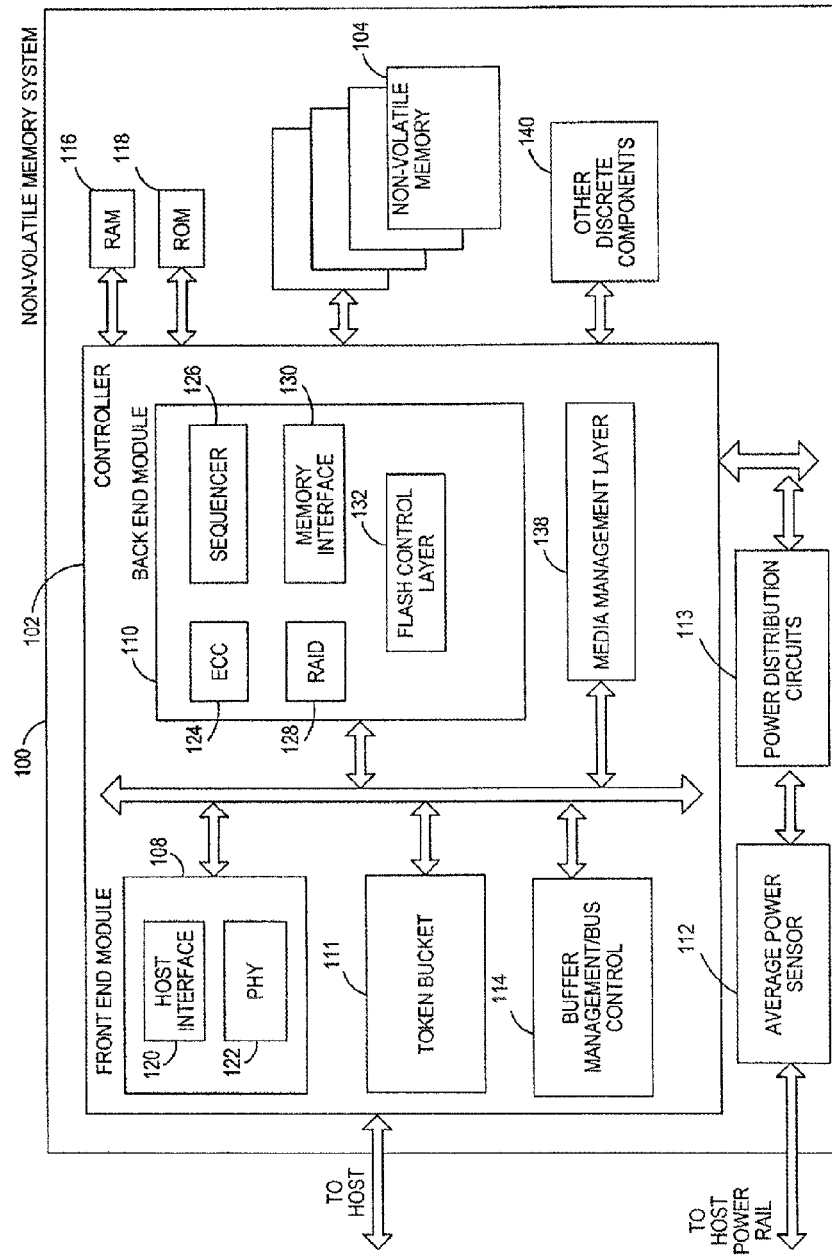
FIG. 2A is a block diagram illustrating exemplary components of the controller of the non-volatile memory system illustrated in FIG. 1A according to an embodiment.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include a power-based operation scheduling module 111 configured to execute operations stored in a queue (e.g., RAM 116) in an order in which they are stored in the queue unless performing an operation would exceed a maximum power limit, in which case the power-based operation scheduling module 111 is configured to perform another operation stored in the queue, so the maximum power limit would not be exceeded. These modules will be discussed in more detail below.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include a token bucket 111 (sometimes referred to herein as an energy bucket). In one embodiment, the token bucket 111 is used to control power use in the memory system 100, as discussed in more detail below. (While the word "token" will be used herein for simplicity, more generally, a "token" is an example of a variable credit value that indicates an amount of energy currently available.) The token bucket can be implemented in any suitable way. For example, in one embodiment, the token bucket 111 is implemented by dedicated hardware formed as part of the memory controller 102

(which may be an Application Specific Integrated Circuit, or ASIC), implemented through software or firmware in the memory controller 102, or implemented through a combination of hardware and software. In one arrangement, the token bucket 111 is implemented as a counter with firmware that initiates the counter to an initial value and maintains the value in the counter according to a token bucket scheme. In one embodiment, the token bucket 111 is implemented as an n-bit counter with a suitable routine to initialize the bucket and add tokens as appropriate and another routine to check the bucket prior to performing an operation and update the bucket 111 as energy is consumed.

The memory system 100 also includes an average power sensor 112 and power distribution circuits 113. The average power sensor 112 (which can be a hardware component) senses an average power drawn from a host power rail and supplied to the power distribution circuits 113. The power distribution circuits 113 distribute power to various components in the controller 102. The average power sensor 112 and the power distribution circuits 113 will be discussed in more detail below.

The memory system 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
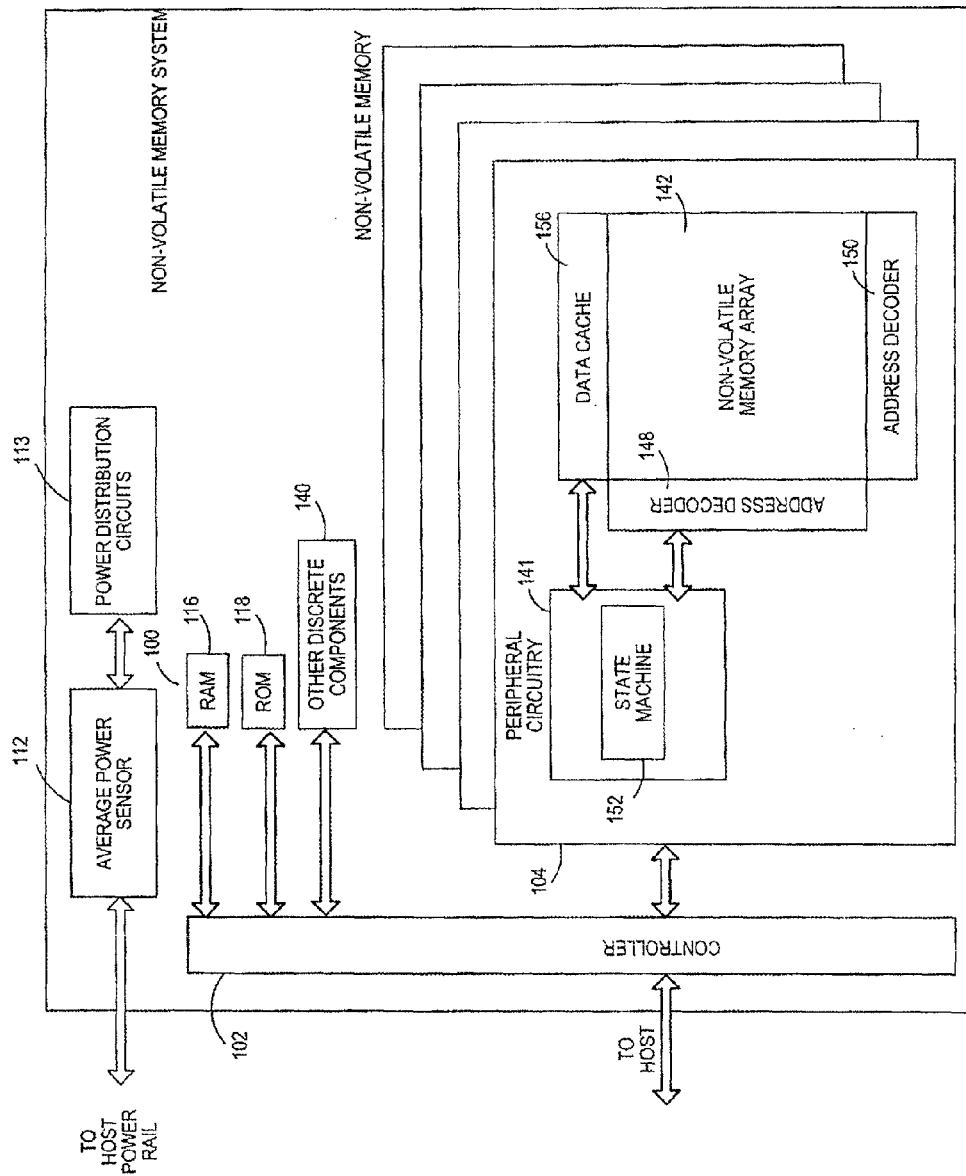
FIG. 2B is a block diagram illustrating exemplary components of the non-volatile memory storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

As mentioned above, in one embodiment, the memory system 100 comprises a token bucket 111. The following paragraphs provide an overview of some exemplary operations of the token bucket 111.

The rate at which the memory system 100 uses energy is largely determined by the rate at which read, write, and erase operations are performed. The memory controller 102 manages these functions and thus determines the rate of energy use. While various mechanisms may be used to control energy use, in one embodiment, the memory system 100 uses a token bucket 111 in the memory controller 102 to perform such control. (As mentioned above, while the word "token" will be used herein for simplicity, more generally, a "token" is an example of a variable credit value that indicates an amount of energy currently available.) The token bucket 111 may be implemented by dedicated hardware formed as part of the memory controller 102 (which may be an Application Specific Integrated Circuit, or ASIC), implemented through software or firmware in the memory controller 102, or implemented through a combination of hardware and software. In one arrangement, the token bucket 111 is implemented as a counter with firmware that initiates the counter to an initial value and maintains the value in the counter according to a token bucket scheme.

Figure 3:
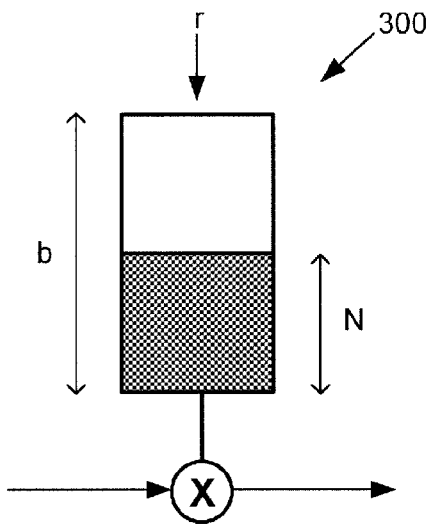
FIG. 3 is an illustration of a token bucket of an embodiment.

FIG. 3 is an illustration 300 of a token bucket 111 of an embodiment. In this example, the operation of the token bucket 111 is analogous to a bucket that is filled to a particular level N at any given time (where N is the number of tokens in the bucket 111), the bucket 111 having a maximum capacity b (maximum number of tokens that bucket 111 can contain). Before a power-consuming operation is performed, the token bucket 111 is checked ("X") to see if enough tokens are available to perform the operation. Thus, when the host sends a write command and some data to be written, the memory controller 102 determines the individual write operations involved, and, for each write operation, the controller 102 checks the token bucket 111 before the data is written in the memory 104. In this way, operation of the memory system 100 may stay within specified limits.

Energy consumption limits may be set in a number of ways. The size of the token bucket b represents the largest amount of energy that may be consumed in a burst. In one example, where it is desirable to program four upper pages in parallel, and each page programming operation uses 5500 mJ/us, the maximum power is 22000 mJ/us, and b is selected accordingly. In one embodiment, any operation or combination of operations that would use more than b tokens is not possible in a given time period. Any such operation(s) are preferably carried out over more than one time period. Tokens are preferably added to the token bucket 111 to replace tokens that are removed as a result of power consumption. The rate at which such tokens are added represents the maximum average energy consumption. In FIG. 3, the rate at which tokens are added is represented by r. In general, r depends on the host interface standard. Tokens are added at a rate r, or one token is added every 1/r seconds. In some cases, it may not be possible or desirable to add one token every 1/r seconds (e.g., if the clock resolution is not sufficient). So, instead, a number of tokens can be added every S milliseconds, the number given by (r*S)/1000. If the token bucket 111 is already full (i.e., if N=b), then any tokens to be added to the bucket 111 are not added but are discarded (i.e., in one embodiment, the bucket 111 cannot hold more than b tokens). The token bucket 111 may be implemented as an n-bit counter with a suitable routine to initialize the bucket and add tokens as appropriate and another routine to check the bucket prior to performing an operation and update the bucket 111 as power is consumed.

Prior to performing a power-consuming operation, the number of tokens N in the token bucket 111 can be checked to make sure that there are enough tokens. If insufficient tokens are available, the operation may be stalled. For example, when a write operation is received that requires n tokens (where n is the amount of power times the duration of the operation (mW*uS)), the token bucket 111 can be checked to see if it contains at least n tokens. When a power-consuming operation is performed, the number of tokens in the token bucket 111 is reduced according to the energy consumed. Thus, for a write operation requiring n tokens, the number is reduced by n. Similarly, for an erase operation, the number may be reduced by an amount that represents the energy consumed in erasing a block or metablock (unit of erase). And for a read operation, the number may be reduced by an amount that represents the energy consumed in reading a page. In some cases, writing different pages may consume different amounts of energy (e.g., upper page write generally consumes more energy than lower page write).

The rate r may be determined as follows. Let a be the desired average power. Let b be the allowed energy burst size. Then set the rate r to be: r=a−(b/1 sec).

For example: Let a be 100 mW. Let b be four D3 upper page programming times (4×0.55 mJ)=2.2 mJ. Then set the rate r to be: r=100 mW−2.2 mJ/sec=97.8 mJ/sec.

Figure 4:
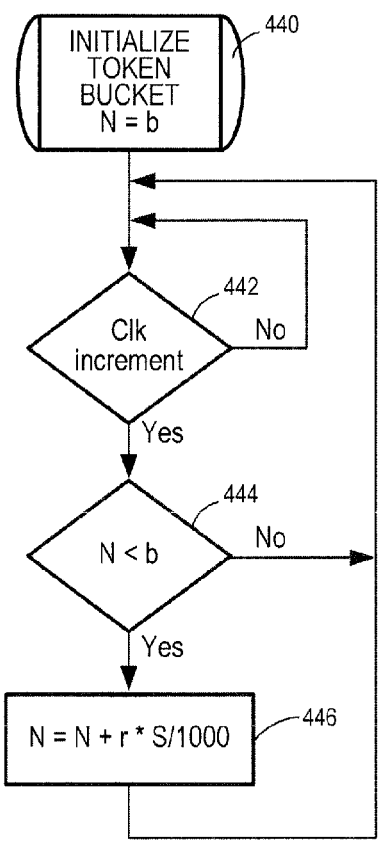
FIG. 4 is a flowchart of a method of an embodiment for adding tokens to a token bucket.

FIG. 4 shows a routine for initializing a token bucket 111 and adding tokens to the token bucket 111 during operation. The token bucket 111 is initialized (act 440) with the number of tokens in the bucket N set to the maximum number of tokens b. The routine then waits for a clock cycle (act 442) and checks to see if the token bucket 111 is full (if N=b) (act 444). If it is still full, then the routine returns to wait for the next clock cycle (act 442) without adding any tokens. If the token bucket 111 is not full, then the number of tokens in the token bucket 111 is increased by (r*S)/1000 (act 446). Then, the routine returns to wait for the next clock cycle (act 442). The routine of FIG. 4 may be implemented in firmware using an interrupt routine, or it may be provided as a timer/counter in hardware for high precision timing.

Figure 5:
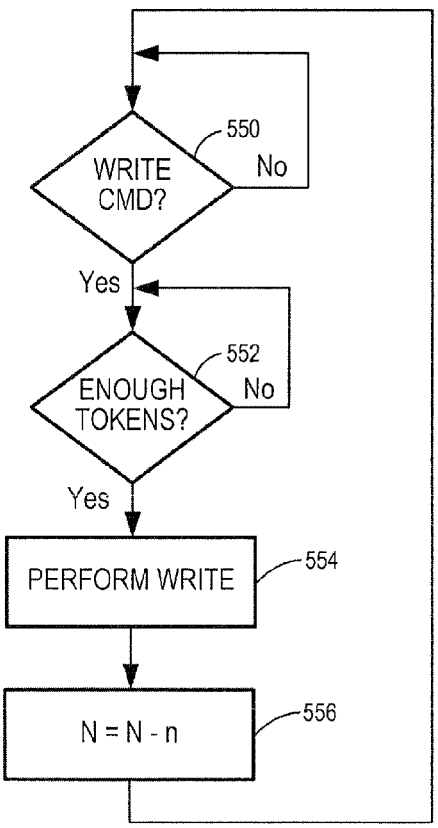
FIG. 5 is a flowchart of a method of an embodiment for using a token bucket with a memory write operation.

FIG. 5 shows a routine for performing write operations using a token bucket 111. The routine waits for a write command to be received from a host (act 550). Then, the routine checks to see if there are enough tokens in the token bucket 111 to carry out a write operation (act 552). If there are not enough tokens, the routine stalls until enough tokens are present in the token bucket 111 (more tokens are added at each clock cycle). Then, the write operation is performed (act 554). The number of tokens in the token bucket 111 is then reduced (act 556) by a number n that represents the energy consumed in the write operation. The routine then returns to wait for another write command (act 550). It should be noted that FIG. 5 shows the number of tokens being reduced (act 556) after the write is performed (act 554), but the order of these steps is not critical. The number of tokens may alternatively be updated before the write operation or during the write operation.

In addition to determining whether a particular write operation may be performed or not, a token bucket may also be used to determine a degree of parallelism to use in performing multiple operations. In various memory systems, operations can be performed sequentially or with some overlap that provides increased speed. However, such parallel operations may cause power consumption limits to be exceeded if they are not managed adequately. Aspects of these embodiments can be used for such management of parallel operations, so that power consumption limits are not exceeded. Also, it should be noted that while many of the above examples refer to write operations that are initiated by a host write command, these embodiments can be applied to other operations as well. Such operations may include write operations that are not directly initiated by a host write command, such as write operations that occur as part of garbage collection, or directory writes. Such operations may also include erase operations, read operations, and various operations performed within a memory controller such as ECC operations.

Figure 6:
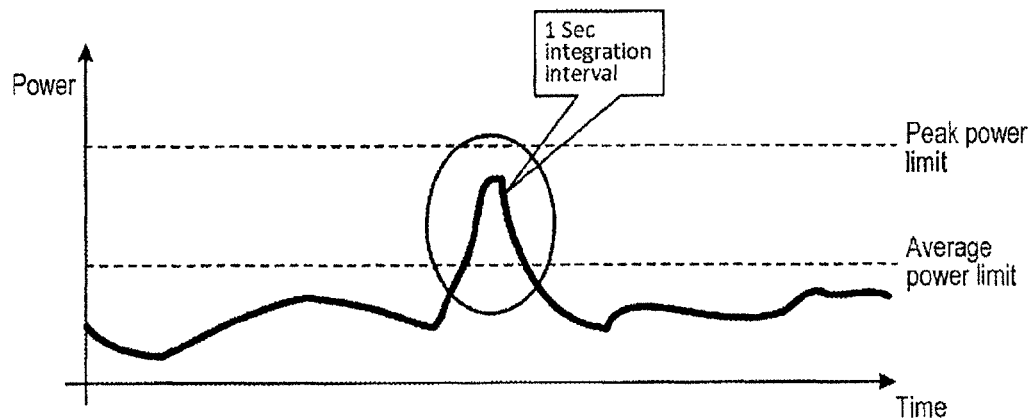
FIG. 6 is a graph showing power versus time for a memory system of an embodiment.

As mentioned above, before or after an operation is performed in the memory system 100, the number of energy tokens in the token bucket 111 is reduced by "n," which represents the number of energy tokens that the operation costs. "n" can be an estimate based on typical or worst case consumption. However, actual systems will often vary from the typical or worst case, so reducing the number of energy tokens by "n" may not represent the actual energy incurred by the memory system 100. Basing power management on worst case consumption is likely to result in underutilizing the available consumption limit of the memory system 100. However, basing power management on typical consumption bares the risk of exceeding the allowed consumption. A memory system may be required to maintain average consumption at a given window interval (e.g., a one-second rolling window). FIG. 6 shows the undesired situation of the memory system exceeding the average consumption limit. As shown in FIG. 6, this graph shows power versus time and illustrates peak power limit, average power limit, and a 1 sec integration interval. (The relevant metric here is average consumption. The total energy consumed in the averaging window is much higher than energy consumption of single memory operation.)

The following embodiments can be used to better optimize average power consumption management by better managing average power consumption to more fully utilize the available consumption limit In general, these embodiments add actual consumption feedback to the energy token bucket concept discussed above. In this way, the value "n" can more accurately reflect the actual energy cost of a memory operation. With this addition, these embodiments can be used to minimize average consumption safety margins and power throttling, thus allowing a better performance. The following embodiments will be discussed in terms of a token bucket client/server infrastructure. However, it should be understood that other infrastructures can be used.

As discussed above, the token bucket 111 maintains an allowed average power consumption by granting energy tokens from the bucket 111. New energy tokens (units) are added to the token bucket 111 at a configured fill rate, which correlates to the allowed sustain power consumption. In one embodiment, the total bucket maximum capacity is the amount of energy allowed to be dissipated at a burst duration, which temporarily consumes more power than is allowed by the host. The token bucket 111 serves as a short term buffer. At times, the memory system 100 may draw more energy than the allowed sustain, and the token bucket 111 will trend towards the empty position. At other times, the memory system 100 may draw less energy than the allowed sustain, and the token bucket 111 will trend towards the full position.

The token bucket 111 fill process of this embodiment is similar to that shown and discussed above with respect to FIG. 4. However, the token bucket 111 empty process is different in this embodiment and is based on a sensed average power over an update cycle, rather than by an assumed typical or worst case consumption. As used herein, an "update cycle" is the period of time over which sensed average power is computed. In one embodiment, the update cycle is 10 ms, although other periods of time can be used. Further, as will be discussed in more detail below, in other embodiments, the update cycle duration is variable based on various conditions. The token bucket 111 empty process will now be discussed in more detail in conjunction with FIGS. 7 and 8.

Figure 7:
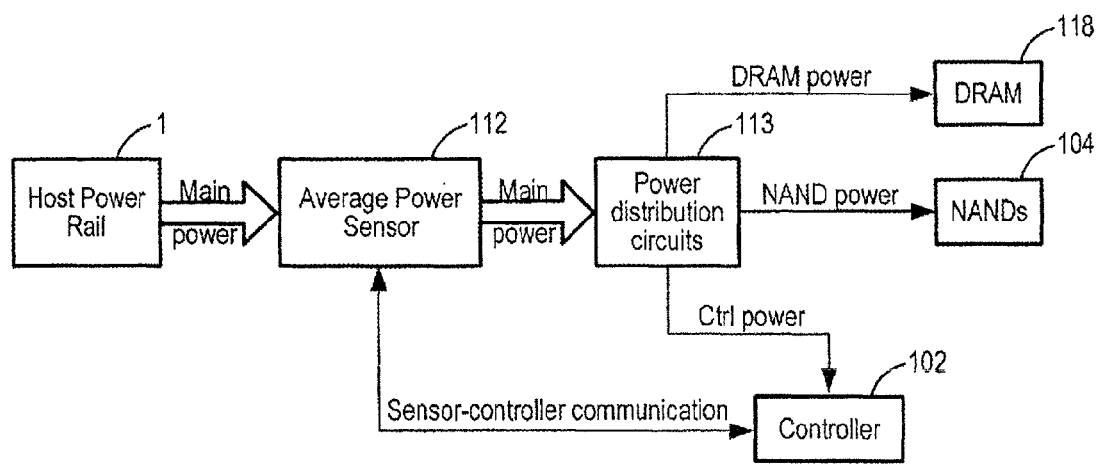
FIG. 7 is a block diagram of a memory system of an embodiment.

FIG. 7 is a block diagram showing a subset of the blocks discussed above with respect to FIGS. 2A and 2B. Specifically, FIG. 7 shows a power sensor 112 that senses average power as main power passes from the host power rail 1 to power distribution circuits 113. The power distribution circuits 113 supply DRAM power to the DRAM 118, NAND power to the memory dies 104, and Ctrl power to the controller 102. Average power can be constantly sensed by the sensor 112 interposed between the host power rail 1 and the power distribution circuits. The controller 102 can communicate with the sensor 112 via a Sensor-controller communication bus, and the controller 102 can read out power information. The token bucket emptying process will now be described.

Figure 8:
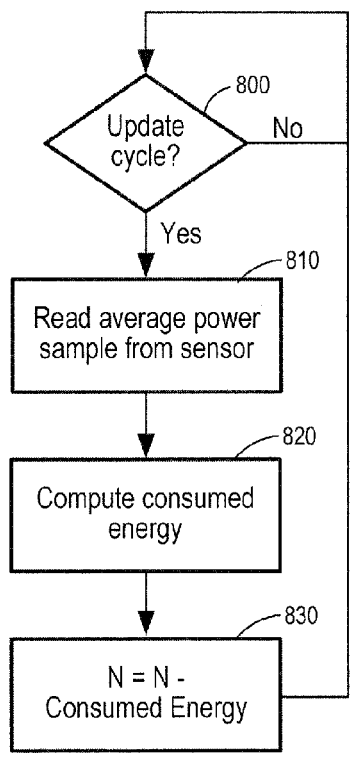
FIG. 8 is a flow chart of a method of an embodiment for emptying a token bucket.

As shown in the flow chart of FIG. 8, when the controller 102 is ready to update its cycle (before or after a memory operation is performed) (act 800), the controller 102 reads the average power sample from the sensor 112 (act 810). The controller 102 then computes the consumed energy of the memory system 100 (act 820). The consumed energy can be computed in any suitable way. For example, computed energy can be result of the following formula: [energy]= [update cycle duration]*[average power].

In another embodiment, the power sensor 112 can be replaced by a component that senses average current and average power. In this embodiment, the average power can be the result of the following formula: [average power] =[average current]*[average voltage]. And, computed energy can be the result of the following formula: [update cycle duration]*[average voltage] * [average current]. If said sensor supports only current sensing and does not support voltage sensing, then a nominal or maximum voltage (e.g., 5 v or 5.5 v) can be used. So, in computing average power, the memory system 100 can multiply measured average current with measured or assumed average voltage. Alternatively, power can be computed by $I^2R$, with R being the resistance value of the memory system 100.

Next, the controller 112 empties the token bucket 111 by subtracting the computed consumed energy from the amount of tokens ("N") in the token bucket 111 (act 830). In this way, the token bucket 111 maintains a variable credit value that indicates an amount of energy currently available for memory operations in the memory system 100. The variable credit value is determined by the difference between a maximum power limit for the memory system and consumed energy.

Figure 9:
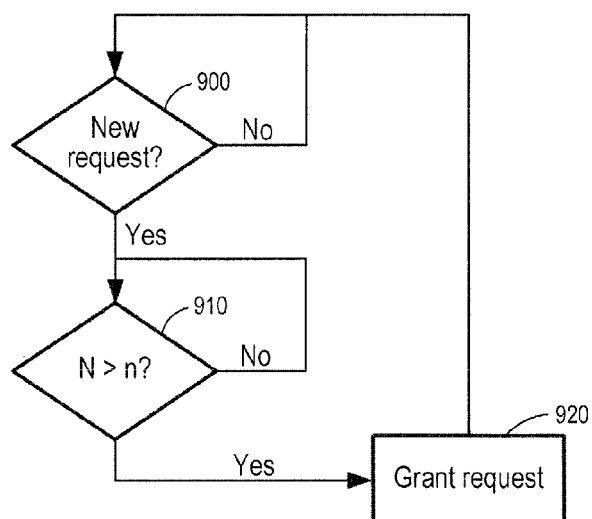
FIG. 9 is a flow chart of a method of an embodiment for granting a request to perform a memory operation.

As shown in FIG. 9, when the memory system 100 receives a request to perform a memory operation (act 900), the controller 102 determines if the token/variable credit value (N) is greater than a minimum value (n) (act 910). The controller 102 grants the request to perform the memory operation only if it is (act 920). Accordingly, if the total number of tokens in the token bucket 111 is below the minimum threshold, then the next memory operation is withheld. 'n' can be zero if energy requests are issued before an operation and may be a positive number when requests are being issued after the fact. In the latter case, 'n' can be chosen to be the total energy consumed by the different operations on credit basis.

There are many alternatives that can be used with these embodiments. For example, instead of the consumed energy being computed (e.g., using the sensor 112), the consumed energy can be measured. In this alternative, the exact number of tokens required to complete an operation is determined only at the end of the operation. While typical energy can be calculated by the following formula {[typical current]*[typical voltage]*[typical operation duration]}, a more accurate cost calculation can be possible if taking the actual operation statistics into account. The memory 104 can be equipped with duration, average voltage and average current sensing capabilities. The actual operation energy can be obtained from the memory 104 reporting the operation energy consumption. If the memory 104 can only sense average current and duration but cannot sense voltage, then the memory 104 can report operation charge (current*duration) back to the controller 102, and the controller 102 can compute operation energy by using the formula energy=charge*nominal voltage. The actual operation duration can be obtained from: (a) the memory 104 reporting the exact time it took for an operation, (b) the memory 104 reporting the number of programming loops and controller 102 multiplying this by a typical programming loop duration, or (c) the controller 102 timing the operation duration. The actual operation current can be reported by the memory 104, for example, if the memory 104 contains a measurement circuit that correlates current consumption.

Another alternative relates to the order of operations. In one embodiment, the actual operation token request is issued to the server after the fact, and the energy client can wait until this request is granted. In such case, the minimum token threshold is preferably positive. In an alternate embodiment, the energy client can issue a worst-case token request just before performing an operation and "payback" the token difference when the operation is done and the actual energy usage is known.

Another alternate embodiment relates to where the token bucket is implemented. In some of the above embodiments, the token bucket 111 was implemented in a controller 102 of a memory system 100 (see FIG. 1A). However, as shown in FIG. 1B, a plurality of memory systems 100 can be grouped together in a storage module 200. In this embodiment, it may be preferred to have the token bucket be implemented in the storage controller 202 that is positioned between the host and the storage module 200. The storage controller 202 would be in a better position to manage power of the entire storage module 200, as individual memory system controllers 102 would not know what power-consuming operations the other memory system controllers 102 are performing. Having the storage controller 202 implement the token bucket would help avoid the situation where each of the memory systems 100 uses power within its own internal limits, but the simultaneous use of the memory systems 100 causes the entire storage module 200 to exceed its power limit. Of course, other levels of granularity can be used as well.

Also, although the storage controller 202 would be aware of any host-initiated operations and can adjust the token bucket accordingly, it is possible that individual memory system controllers 102 may be performing internal memory management operations that may be consuming power as well. Accordingly, it may be preferred that the storage controller 202 communicate with the individual memory system controllers 102 to learn of such internal operations and adjust the token bucket accordingly for the power consumed by those internal operations. It may also be preferred to use a shorter update cycle for the token bucket in this embodiment to help ensure that the storage controller 202 is timely informed of the power usage of the individual memory systems 100.

Figure 10:
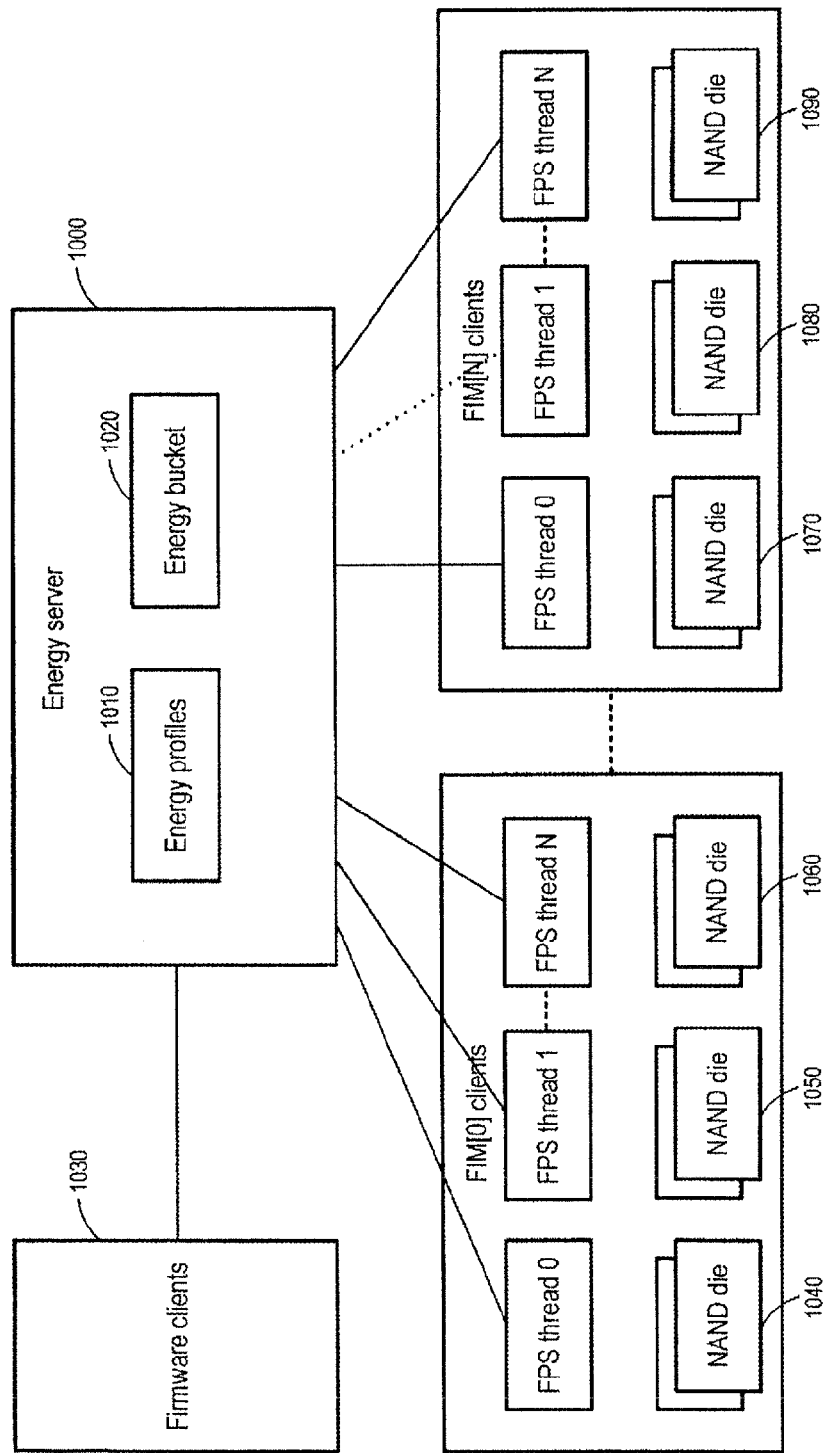
FIG. 10 is a diagram of an energy server-client architecture of an embodiment.

As mentioned above, in one embodiment, the token bucket concept is implemented as a client/server infrastructure. FIG. 10 is an example of one such implementation (of course, other implementations are possible). As shown in FIG. 10, an energy server 1000 is used to store energy profiles 1110 and an energy bucket 1020 (which can take the form of the token bucket discussed above). The energy server 1000 is in communication with firmware clients 1030 and a plurality of flash interface modules clients (FIM[0] clients to FIM[N] clients). Each FIM client comprises 0-N flash protocol sequence (FPS) threads, each being associated with a plurality of memory dies 1040-1090.

In one embodiment, a hardware/firmware-based power allocation system is used to accelerate the way power is dynamically allocated and managed across memory systems. In general, a centralized server and distributed client system can be used to maintain a power budget. The power server maintains a maximum power consumption to be within required limits. The server grants power usage to the client. Power may be allocated according to preset priority, and it is possible to assign clients with a priority level (e.g., so that the highest priority client will always be served first). Among equal priority clients, power can be allocated according to a first-in-first-out method, for example.

In this embodiment, some clients are designated as "power clients." The client requests should preferably be posted at a time as close as possible to the actual operation being performed to help ensure the maximum power management is accurate and that the power budget is fully utilized. The controller 102 can include a buffer manager (DRAM module 116) as a client. When an ECC module, such as LDPC, is used, the module can consume substantial power. The power request can result in staggering the LDPC engines' operation in case multiple engines are operating simultaneously.

Typically, dominant power and energy are consumed by memory devices performing an operation (e.g., a NAND program operation). The NAND interface, especially in a configuration with many die loading and high speed (e.g., 16-die loading and/or fast toggle mode 400), is power hungry. Thus, backend clients are preferably located in the flash sequencer. In cases where the frontend interface (e.g. NVMe over PCIe) can be placed in several power states (e.g., high and low power), the frontend may be a power client as well.

Regarding the timing of a client power request, the flash sequencer can issue a request for power just before executing the requested operation and waiting for grant. In case grant is not being provided due to insufficient power resources in the system, the client may be stalled waiting. As such, power requests can be issued by the client with a timeout value. The timeout can be set to span the entire operation duration plus or minus an optional margin. Operations such as NAND bus data transfer can be very accurate; therefore, the payback method can be based solely on the timeout mechanism. Nevertheless, if the flash sequencer thread is active, the client-payback can be used as well.

Other operations can be issued for lengthy operations (i.e., a NAND program operation) that may be subject to large variance between worst case timing to typical case. Basing the power payback mechanism on a timeout may result in suboptimal performance when throttled. Therefore, especially for program operations, it may be preferred to consider the client, so as to payback the power accurately to the power server if possible.

Power timeouts can be set to a value that is a worst-case condition. Nevertheless, the power consumption can typically be shorter than the timeout duration. Relying on timeouts alone can lead to a situation in which the SSD underutilizes its power budget. Thus, the client-payback method may be preferred when possible. There are, however, cases when timeout payback is helpful (e.g., when a flash sequencer thread is occupying the NAND interface and, by that, is preventing a status check and is following client-payback by another thread). If the timeout expires before the flash channel thread has a chance to client-payback, the timeout mechanism may benefit the system with an early power check in. Each client can be assigned a set priority that is initialized by firmware and can be modified in run time. The backend client may be assigned low priority.

Turning now to the power server, the purpose of the power tokens request is to limit the maximum power consumption. Violating such requirements may result in a voltage drop and negative host effects. Therefore, it is preferred that the memory system power limit be maintained at all times. Firmware can initialize the server to the number of total available power tokens.

The memory system 100 can have several power rails, each with its own dedicated power regulator. The power regulator cost can correlate to its current rating. Limiting power on a specific power rail limits the power circuit cost. The power server can support multiple "mini-buckets" (e.g., two) for that purpose (e.g., the NAND core 3.3 v rail mini-bucket and NAND interface 1.8 v rail mini-bucket). The mini-bucket can fill and empty together with the total bucket, and its use is to support the process of granting a request based on localized power usage. Each request profile can include information regarding mini-bucket classification, and there may be several options (e.g., no mini-bucket, NAND core mini-bucket, or NAND interface mini-bucket).

Figure 11:
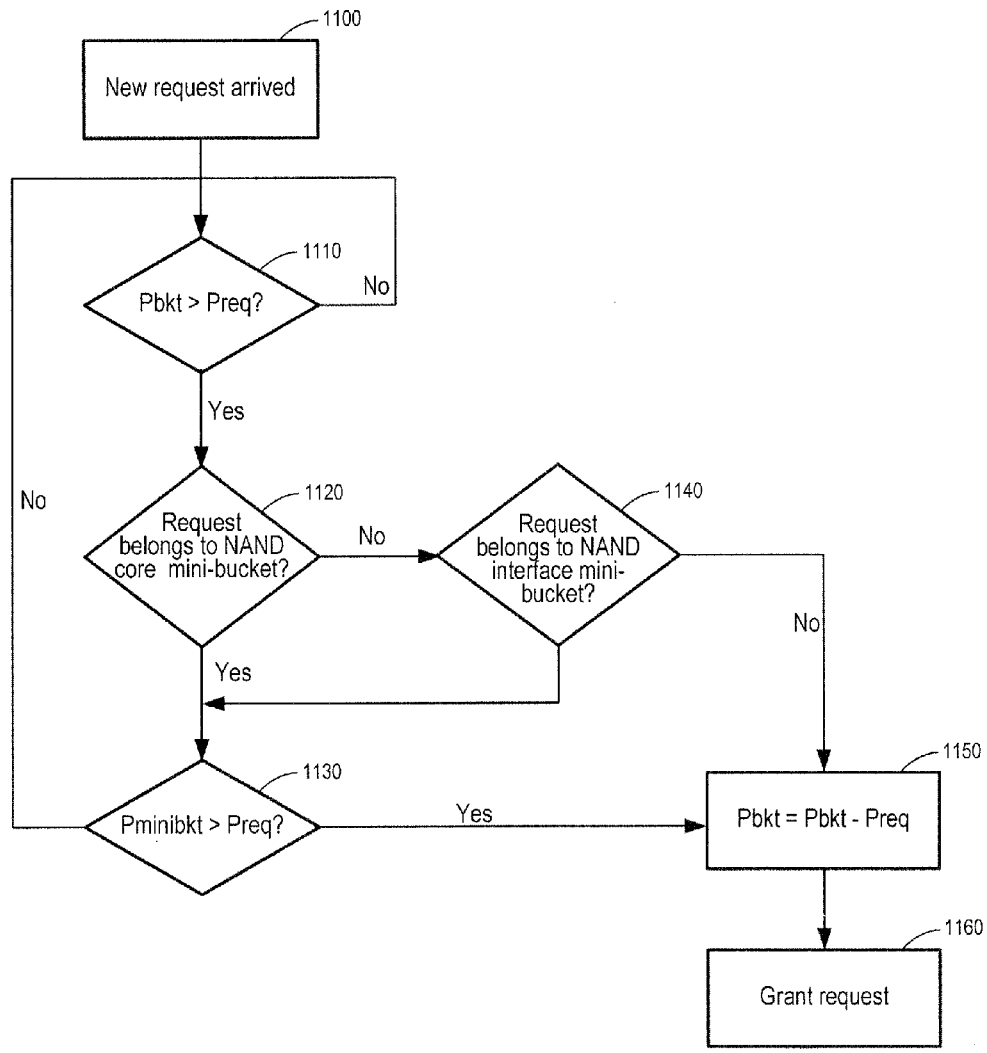
FIG. 11 is a flow chart of a power grant process of an embodiment.

Clients can asynchronously request power from the server as illustrated in the FIG. 11. In this figure, "Pbkt" denotes tokens available in the power server, and "Preq" denotes requested tokens. As shown in FIG. 11, when a new request arrives to the power server (act 1100), the server check the amount of tokens requested versus the amount of tokens available in the power bucket (act 1110). If a sufficient amount of tokens is available in the power bucket, the controller 102 determines if the request belongs to the NAND core mini-bucket (act 1120). If it doesn't, the controller 102 determines if the request belongs to the NAND interface mini-bucket (act 1140). If it doesn't (or if the number of tokens in the NAND core mini-bucket Pminibkt is greater than the requested number of tokens Preq (act 1130), the controller 104 subtracts the requested number of tokens Preq from the bucket (act 1150) and grants the request (act 1160).

In this embodiment, the server decrements the amount of tokens from the power bucket upon granting a power request. Also, the power request can specify the expected maximum power that the following operation could consume. This is to minimize or eliminate the probability of several modules' maximum powers aligning and resulting in a maximum current that exceeds the limit.

Figure 12:
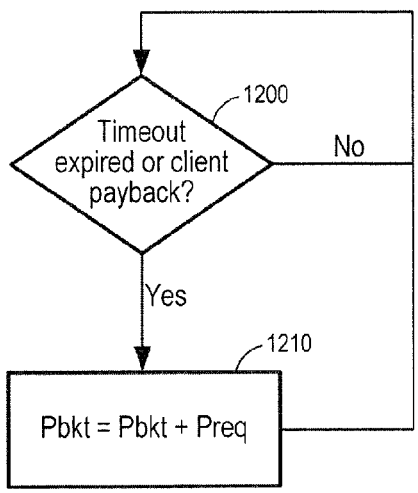
FIG. 12 is a flow chart of a power bucket filling process of an embodiment.

Also, in this embodiment, the power bucket gets filled when a power consuming operation has ended. In principal, it is desired that the power will be de-allocated exactly when the operation ends. In practice, it is challenging for the server to know exactly when the operation practically ended. Two possible methods that can be used to address this are a client-payback mechanism and a timeout mechanism. A client can use the timeout mechanism, the client-payback mechanism, or a combination of both. As shown in FIG. 12, in the power bucket filling process, the controller 102 determines whether the timeout has expired or if the client needs to payback (act 1200). If either is true, the controller 102 adds the requested power tokens to the power bucket (act 1210).

In this embodiment, the server keeps track of all current power allocations and relevant timers, so that the correct amount of tokens will be added upon timeout expiration or client payback. The request profile can include a defined timeout. Once the power request has been granted and the operation starts, power tokens can be decremented from the power bucket for a specified duration. As soon as the timeout expires, these tokens can be incremented into the power bucket. Also, the power client may have knowledge when an operation has ended. The power client may write to a designated register indicating operation completion. When a client-payback event happens, the operation power tokens can be incremented into the power bucket. Both filling methods may be used in combination. An example for combination of timeout and payback is when a worst case timing is set as a timeout value. If the client has knowledge of operation completion prior to the timeout expiration, then it may indicate completion, and the power would be paid back to the system at a timing better than the worst case. When a combination is used, the power server can be paid-back as soon as the first indication occurs (either timeout or end of operation) and can ignore the second indication associated with the specific operation, if such occurs. The client may use a different payback mechanism per different operation. For example, the backend client may use only timeout for data transfer to NAND while using a combination of timeout and client-payback can be used for NAND program operations.

A client can set an operation start bit to notify the power sever of the exact timing of the power consumption. The power server starts counting the timeout period once a client has set the operation start bit. A client can set an operation end bit to notify the power server of the exact timing for ending the power consumption. Setting the operation end bit indicates the client-payback.

Also, multiple power requests issued by same flash channel, same flash sequencer thread, and referencing same NAND die can be linked. When two power requests are linked, they form a two-node request pair constituting header and trailer requests. Note that it is possible that a trailer request [N] will become a header if a later request [M] is linked to request [N]. The power server is preferably required to maintain only two node-linked power requests. The flash sequencer preferably indicates to the power server if a power request is to be (a) independent request, (b) a header request, (c) a trailer request, or (d) both header and trailer requests.

If a request is indicated to be both header and trailer, it means that this request [M] acts as a trailer and is linked to a previous request [N], which acts as a header. At some point, request [N] expires (e.g., either because of timeout or client-payback). At a later point, request [O] is issued to be a trailer. At that point, request [M] acts as a header and is linked to request [O], which acts as trailer. Independent unlinked requests may be issued at any time before, during, or after issuing linked requests. Also, each node in linked request pair preferably requests the same amount of power tokens; however, each node may request different timeout values and/or energy tokens. The linked requests may be issued for different operation types but preferably have the same operation ID (operation ID can be constituted by the flash channel, thread, and die information). A linked request is preferably granted by the power server following the normal arbitration process of first-in-first-out. The request preferably waits until all former requests have been granted by the server. The power server preferably executes a trailer request as soon as the relevant header request has expired.

Some operations have deterministic power consumption attributes. For example, the first few peaks of a programming operation may occur at same offset each time the command is issued. Therefore, it is beneficial to stagger issuance of similar operations in time to prevent peak current alignment. On the other hand, the system may be tolerant to a few operations being issued simultaneously. To accommodate these considerations, the stagger engine can delay a client request from being evaluated by the server. The delay can be between operations within the same stagger bank by a stagger delay. Stagger bank and stagger delay are both defined in the operation profile. In one embodiment, there are up to 16 different stagger banks, and each operation may be assigned only to one bank (of course, other configurations are possible). For example, different program operations (e.g., lower, middle, upper, etc.) may be assigned to one bank. The stagger delay defines the minimum duration that the stagger engine needs to wait between previous bank operation grant and next bank operation evaluation. Subsequent client requests may arrive to the server while a request is being delayed by the stagger engine. On such event, the stagger engine can allow these requests to be evaluated and granted in order of arrival until the stagger delay has elapsed, and the delayed request will be evaluated by the server. This mechanism assures that a delayed request will not stall the entire system.

In order to simplify the flash sequencer client implementation and in order to avoid performance impact, the flash sequencer client can be designed to perform no math or complex operations. The flash sequencer client can instead request an operation profile indexed by operation type. The server can maintain a look up table in which an operation type is mapped to an amount of power tokens and a power server-payback expiration timeout. The profile look up table can be initialized by the firmware and may be modified during operation to update for adjustments in module power consumption, which may result from changing mode of operation (e.g., reducing clock frequency) or other effects (e.g. aging effects). In one embodiment, the power minibucket association information is included in the request profile, and the stagger class information is included in the request profile.

The power values can be populated by firmware. The values are preferably accurate enough in order to fully utilize the allowed power budget. Values too low can result in exceeding the power envelope, while values too high can result in reduced performance results when power is throttled. The firmware can read the profile values from the file system to populate the server and can suspend the server prior to populating the profiles. The server can withhold multiple client requests due to insufficient power and keep them pending at the server. Upon power availability, the server can grant the pending requests on a priority based on a first-in-first-out manner with no re-ordering of equal priority requests. The server first grants the highest priority requests based on a first-in-first-out manner, followed by the lower priority requests and so on. Generally, low priority clients may reach starvation. The probability for the server to receive multiple requests at the same time (i.e., same clock cycle) may be low, but it may happen. The arbitration method may have a negligible effect on performance. In such event, the server can arbitrate by a simple round robin.

Figure 13:
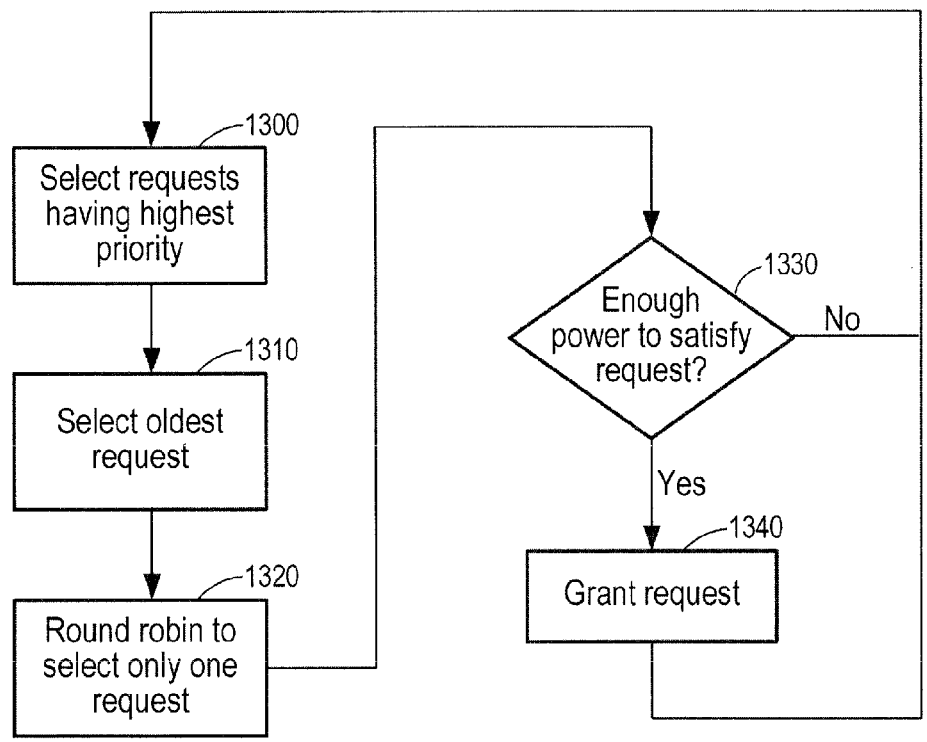
FIG. 13 is a flow chart of an arbitration flow of an embodiment.

FIG. 13 is a flowchart of an arbitration method of an embodiment. As shown in FIG. 13, the controller 102 first selects requests with the highest priority (act 1300) and then selects the oldest of those requests (act 1310). The controller 102 then uses a round-robin process to select only one request (act 1320). The controller 102 checks to see if there is enough power to satisfy the request (act 1330), and, if there is, the controller 102 grants the request (act 1340).

As described above, the token bucket fill rate is preferably lower than the allowed average power consumption because the sustained state preferably "compensates" for a momentary power burst. In some approaches, the energy bucket maximum size is fixed to be the peak power limit. As the bucket allows "energy bursts," the bucket fill rate is lower than the average power allowed by the memory system to be consumed. In some circumstances, the penalty can be suboptimal power usage under a maximum performance sustain workload. The following embodiments can be used to better optimize an energy bucket power management approach to maximize memory system performance per system workload. This can help optimize power allowed to the fullest extent. In cases where power is throttled, power saving is translated to performance increase.

Several different configuration pairs of energy bucket fill rate and bucket capacity can result in same memory system maximum long duration average power consumption. For example, a longer power burst coupled with lower sustain power consumption can yield the same average power as a shorter power burst coupled with a higher-allowed sustain power consumption. However, there may be a difference between the above-mentioned setting points. A longer power burst coupled with lower sustain power could match a bursty host workload where the host issues concurrent multiple requests followed by a lower activity period (or even idle period). Such behavior may be a typical usage case for typical user (e.g., web browsing). On the other hand, higher allowed sustain power coupled with shorter power bursts could better fit a sustain performance benchmark or different user workloads (e.g., HD video playback).

In order to adaptively optimize for the different actual host workloads, it is preferred to track and adjust the energy server parameters on the fly as a response to the changing host workload. The memory system 100 can maintain a set of N (e.g., 5) different energy bucket configurations. These configurations can be kept in a look up table that is stored in the file system. FIG. 14 is an example of such a table, which includes the following column headings: Set Number, Unconstraint Power [W], SSD Allowed Power [W], Power Burst Duration [msec], Bucket Capacity [tokens], Steady State Power [W], Bucket Fill Rate [tokens/sec], and Usage. The bucket capacity and bucket fill rate columns can be maintained while the other columns can be informative.

In one embodiment, a dynamic optimal energy bucket setting ("DOES" algorithm is used. A simple and sufficient indicator to the DOES algorithm is the average energy bucket fullness state. Preferably, the average fullness would be at 50% level at all times. Average fullness at almost full is indicative of a workload attributed by long periods in which the memory system 100 consumes less than the allowed sustain power, thus allowing the energy bucket to fill up beyond the 50% level. At such host workloads, the host system can benefit from increased power bursts (i.e., higher burst performance) at the expense of a lower sustain power consumption limit (i.e., reduced sustain performance). Conversely, average fullness at almost empty is indicative of a memory system 100 that does not manage to fill the energy bucket before a next burst is required (e.g., host burst is followed by only a short period of reduced activity) or, alternatively, of a memory system that consumes energy on an ongoing basis and not at power burst patterns (e.g., during a long sequential benchmark).

Average fullness can be maintained by the energy token bucket system. The firmware can periodically read the average fullness and compose more complex (or more accurate) statistics based on the readings. An alternative workload indicator is for the host to inform the memory system 100 what the proper workload should be. Some host hinting structure may already be supporting a set of hints that may infer different upcoming access patterns.

In one embodiment, the algorithm for memory system identification of different workloads is implemented using a feedback loop that compares a fullness metric (based on the average energy bucket fullness) to a 50% set point. The algorithm outputs are the bucket new fill rate and maximum capacity. The metric can be composed of weighted proportional, integral, and derivative components. Adjusting the energy bucket parameters is expected to be a slow process; therefore, this control loop is preferably implemented in firmware.

Figure 15:
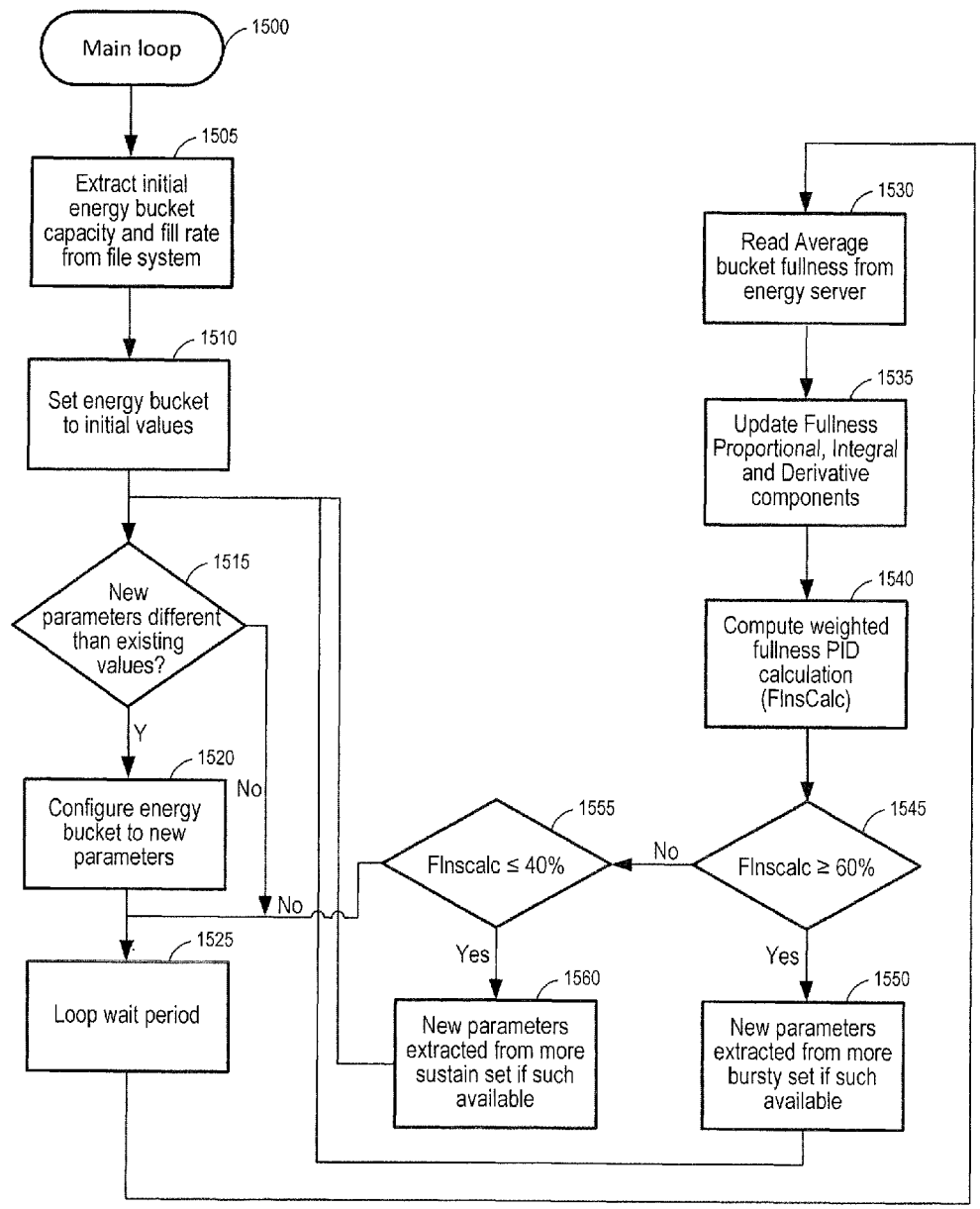
FIG. 15 is a flow chart of a dynamic optimal energy settings method of an embodiment.

FIG. 15 is a flow chart of the algorithm of an embodiment. The loop cycle duration can be slow, and the firmware can to read the fullness status at a faster rate to gather more accurate statistics. As shown in FIG. 15, in one embodiment, the controller 102 begins a main loop (act 1500), in which the controller 102 extracts the initial energy bucket capacity and fill rate from the file system (act 1505). The controller 102 then sets the energy bucket to the initial values (act 1510) and determines if new parameters are different than the existing values (act 1515). If they are, the controller 102 configures the energy bucket to the new parameters (act 1520) and waits for a loop wait period (act 1525).

The controller 102 then reads the average bucket fullness from the energy server (act 1530). Next, the controller 102 updates the fullness proportional, integral, and derivative components (act 1535) and computes the waited fullness PID calculation (FinsCalc) (act 1540). If FinsCalc is greater than or equal to 60% (act 1545), the controller 102 extracts the new parameters from a more bursty set, if available (act 1550). If FinsCalc is less than or equal to 40% (act 1555), the controller 102 extracts new parameters from a more sustained set, if available (act 1560). In an alternate embodiment, the host can send a hint to the memory system 100 about upcoming workload, which may be simpler, as it does not require data gathering and projection.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A method for power management, the method comprising:
maintaining a variable credit value that indicates an amount of energy currently available for memory operations in a memory system, wherein for each update cycle of the variable credit value, the variable credit value is reduced by a computed consumed energy value for that update cycle;
receiving a request to perform a memory operation;
determining if the variable credit value is greater than a minimum value required to perform the memory operation; and
granting the request to perform the memory operation only if it is determined that the variable credit value is greater than the minimum value.

2. The method of claim 1, wherein the consumed energy is computed by determining a product of an update cycle duration and average sensed power.

3. The method of claim 1, wherein a memory in the memory system is a three-dimensional memory.

4. The method of claim 1, wherein the memory system is embedded in a host.

5. The method of claim 1, wherein the memory system is removably connected to a host.

6. The method of claim 1, wherein the method is performed in a controller in the memory system.

7. The method of claim 1, the memory system is part of a storage module having at least one additional memory system, and wherein the method is performed in a storage controller of the storage module.

8. A method for power management, the method comprising:
   maintaining a variable credit value that indicates an amount of energy currently available for memory operations in a memory system;
   receiving a request to perform a memory operation;
   performing the memory operation;
   determining an amount of energy consumed in performing the memory operation; and
   adjusting the variable credit value based on the determined amount of energy consumed in performing the memory operation.

9. The method of claim 8, wherein the amount of energy consumed in performing the memory operation is determined by a memory die in which the memory operation was performed.

10. The method of claim 8, wherein the amount of energy consumed in performing the memory operation is determined by a controller in the memory system after the controller receives, from a memory die in the memory system, an indication of an amount of time spent by the memory die in performing the operation.

11. The method of claim 8, wherein the amount of energy consumed in performing the memory operation is determined by a controller in the memory system after the controller receives, from a memory die in the memory system, an indication of a number of programming loops used by the memory die in performing the operation.

12. The method of claim 8, wherein the amount of energy consumed in performing the memory operation is determined by a controller timing how long it took to perform the memory operation.

13. The method of claim 8 further comprising reducing the variable credit value by a first amount prior to performing the memory operation, wherein the first amount is different from the determined amount of energy consumed in performing the memory operation, and wherein, after the memory operation is performed, the variable credit value is adjusted upward if the first amount is greater than the determined amount and is adjusted downward if the first amount is less than the determined amount.

14. The method of claim 8 further comprising performing the memory operation only after determining that the variable credit value is greater than a minimum value.

15. The method of claim 8, wherein a memory in the memory system is a three-dimensional memory.

16. The method of claim 8, wherein the memory system is embedded in a host.

17. The method of claim 8, wherein the memory system is removably connected to a host.

18. The method of claim 8, wherein the method is performed in a controller in the memory system.

19. The method of claim 8, the memory system is part of a storage module having at least one additional memory system, and wherein the method is performed in a storage controller of the storage module.

* * * * *